United States Patent
Moon et al.

(10) Patent No.: US 8,154,925 B2
(45) Date of Patent: Apr. 10, 2012

(54) SEMICONDUCTOR MEMORY DEVICE AND SYSTEM CAPABLE OF EXECUTING AN INTERLEAVE PROGRAMMING FOR A PLURALITY OF MEMORY CHIPS AND A 2-PLANE PROGRAMMING AT THE RESPECTIVE MEMORY CHIPS

(75) Inventors: SeongHwan Moon, Suwon-si (KR); Jun-Ho Jang, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 277 days.

(21) Appl. No.: 12/697,543

(22) Filed: Feb. 1, 2010

(65) Prior Publication Data
US 2010/0195418 A1    Aug. 5, 2010

(30) Foreign Application Priority Data
Feb. 2, 2009  (KR) ........................ 10-2009-0007943

(51) Int. Cl.
*G11C 16/10* (2006.01)
(52) U.S. Cl. .............. 365/185.09; 365/185.11; 365/200; 365/230.03; 365/189.04; 365/189.16; 365/189.05; 365/189.12

(58) Field of Classification Search ............ 365/189.04, 365/189.14, 189.16, 189.05, 189.12, 200, 365/230.03, 185.12, 185.11, 185.09, 185.33
See application file for complete search history.

(56) References Cited

U.S. PATENT DOCUMENTS
| | | | |
|---|---|---|---|
| 7,379,331 B2 * | 5/2008 | Kasai et al. | .............. 365/185.09 |
| 2006/0203548 A1 | 9/2006 | You | |
| 2007/0288688 A1 | 12/2007 | Kang | |

FOREIGN PATENT DOCUMENTS
| | | | |
|---|---|---|---|
| JP | 2006252747 A | 9/2006 | |
| JP | 2007334863 A | 12/2007 | |
| JP | 2008065859 A | 3/2008 | |
| KR | 100590388 B1 | 6/2006 | |
| KR | 100765786 B1 | 10/2007 | |

* cited by examiner

*Primary Examiner* — Andrew Q Tran
(74) *Attorney, Agent, or Firm* — Volentine & Whitt, PLLC

(57) ABSTRACT

A semiconductor memory device includes first and second memory chips and a control logic configured to execute an interleave program between the first and second memory chips. The control logic receives write data to be written into first and second memory blocks of the first memory chip. If the first and second memory blocks are normal blocks, the control logic simultaneously performs a program operation for the first and second memory blocks. If one memory block of the first and second memory blocks is a bad block, the control logic writes the received write data corresponding to the one memory block into a storage circuit.

20 Claims, 10 Drawing Sheets

SEMICONDUCTOR MEMORY DEVICE AND SYSTEM CAPABLE OF EXECUTING AN INTERLEAVE PROGRAMMING FOR A PLURALITY OF MEMORY CHIPS AND A 2-PLANE PROGRAMMING AT THE RESPECTIVE MEMORY CHIPS

CROSS-REFERENCE TO RELATED APPLICATION

This U.S. non-provisional patent application claims priority under 35 U.S.C. §119 to Korean Patent Application No. 10-2009-0007943 filed on Feb. 2, 2009, the subject matter of which is hereby incorporated by reference.

BACKGROUND

The present inventive concept relates to semiconductor memory devices and incorporating memory systems.

Semiconductor memory devices may be generally classified as volatile and nonvolatile in their operative nature. Volatile semiconductor memory devices lose stored data in the absence of applied power. Nonvolatile memory devices retain stored data when power is interrupted.

Volatile memory devices include static random access memories (SRAM), dynamic random access memories (DRAM), and synchronous dynamic random access memories (SDRAM). Nonvolatile memory devices include read only memories (ROM), programmable ROM (PROM), erasable PROM (EPROM), electrically EPROM (EEPROM), flash memories, phase-changeable random access memories (PRAM), magnetic random access memories (MRAM), and ferroelectric random access memories (FRAM). Flash memories are further classified into two types, i.e., NOR-type flash memories and NAND-type flash memories.

SUMMARY

Embodiments of the inventive concept provide a semiconductor memory device. In some embodiments, the semiconductor memory device may include first and second memory chips and a control logic configured to execute an interleave program between the first and second memory chips. The control logic receives write data to be written into first and second memory blocks of the first memory chip. When the first and second memory blocks are normal blocks, the control logic simultaneously performs a program operation for the first and second memory blocks. When one memory block of the first and second memory blocks is a bad block, the control logic writes the received write data corresponding to the one memory block into a storage circuit.

Embodiments of the inventive concept provide a memory system. In certain embodiments, the memory system includes a semiconductor memory device including a first memory chip and a controller configured to control receipt of write data to be written into first and second memory blocks of the first memory chip. If the first and second memory blocks are normal memory blocks, the controller simultaneously performs a program operation for the first and second memory. If a portion of the storage region to which the write data is to be written into is a bad region, the controller writes the write data corresponding to the bad region into a write circuit.

Embodiments of the inventive concept provide a memory system. In certain embodiments, the memory system includes a semiconductor memory device and a controller a controller configured to control the semiconductor memory device. The semiconductor memory device includes first and second memory chips and a control logic configured to execute an interleave program between the first and second memory chips. The control logic receives write data to be written into first and second memory blocks of the first memory chip. If the first and second memory blocks are normal blocks, the control logic performs a program operation for the first and second memory blocks simultaneously. If the second memory block is a bad block, the controller writes data corresponding to the second memory block in a storage circuit.

DETAILED DESCRIPTION OF THE EMBODIMENTS

Figure 1:
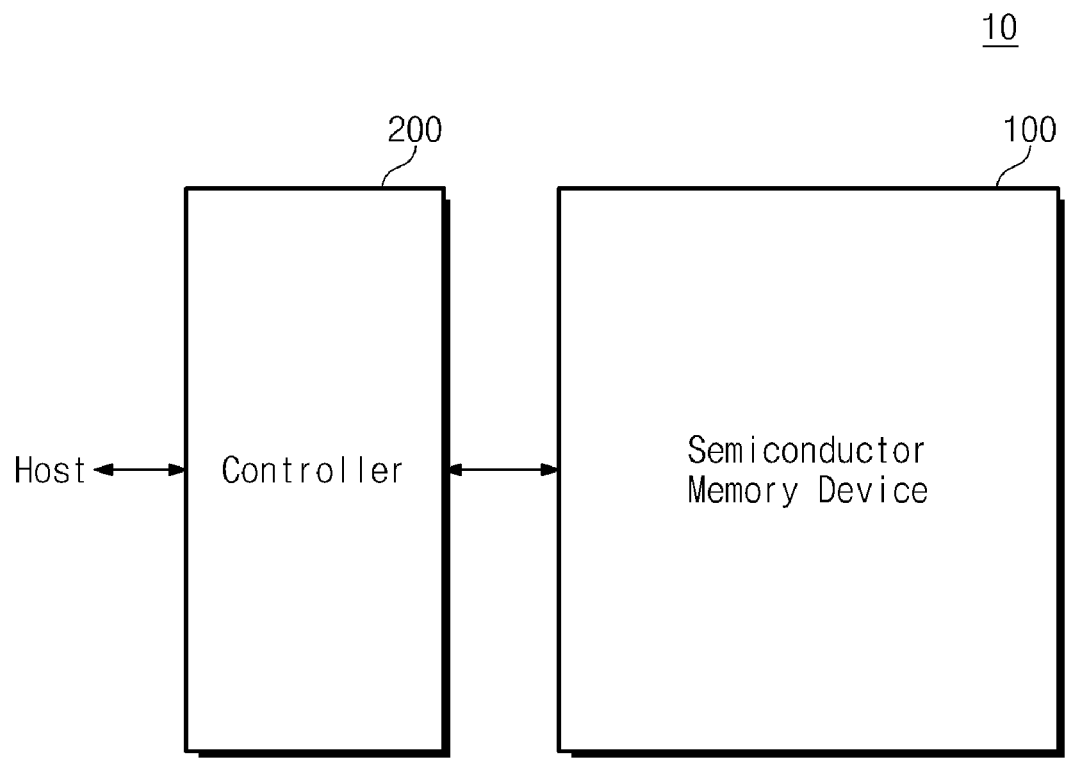
FIG. 1 is a general block diagram of a memory system according to an embodiment of the inventive concept.

Embodiments of the inventive concept will now be described with reference to the accompanying drawings. However, the inventive concept may be variously embodied and should not be construed as being limited to only the illustrated examples. Rather, the illustrated embodiments are presented as teaching examples.

A semiconductor memory device according to an embodiment of the inventive concept generally comprises a plurality of memory devices (e.g., first and second memory chips) and associated control logic configured to perform an interleave operation in relation to the first and second memory chips. The control logic is configured to receive "write data" to be written into first and second memory blocks of the first memory chip. The control logic is further configured to simultaneously program the received write data to the first and second memory blocks when they are "normal" (i.e., properly functioning) blocks, but program the received write data intended for the second block to a storage circuit when the second memory block is a "bad" (i.e., defective) block.

A semiconductor memory system according to another embodiment of the inventive concept generally comprises a memory device including a plurality of memory chips (e.g., first and second memory chips) and a controller configured to control a program operation directed to the memory device. The controller is configured to receive write data intended for the plurality of memory chips. However, when a portion of memory in one of the plurality of memory chips to which the received write data is to be programmed is a bad area (hereafter "bad area write data"), the controller is configured to perform an interleave program operation in relation to the bad area write data which may be alternately written in a storage circuit.

A memory system according to other embodiment of the inventive concept generally comprises a semiconductor memory device and a controller configured to control the semiconductor memory device. The semiconductor memory device includes first and second memory chips and a control logic configured to perform an interleave program for the first and second memory chips. The control logic is configured to receive write data for the first and second memory blocks of the first memory chip, and is further configured to simultaneously program the first and second memory blocks when they are normal blocks and write data corresponding to the second block into a storage circuit when the second memory block is a bad block.

Embodiments of the inventive concept will now be described in some additional detail with reference to accompanying drawings.

Figure (FIG.) 1 is a block diagram of a memory system 10 according to an embodiment of the inventive concept. The memory system 10 comprises a semiconductor memory device 100 and a controller 200.

The controller 200 may include such conventional components as a random access memory (RAM), a processing unit, a host interface, and a memory interface. The RAM may be used as an operation memory of the processing unit. The processing unit may be configured to control operation of the controller 200.

The host interface may enable a protocol controlling (or defining) the exchange of data between a host and the controller 200. In certain embodiments of the inventive concept, the controller 200 may be configured to communicate with an external host using one or more data protocols, such as USB, MMC, PCI-E, advanced technology attachment (ATA), Serial-ATA, Parallel-ATA, SCSI, ESDI, and integrated drive electronics (IDE).

Thus, the memory interface interfaces external data sources and destinations with the semiconductor memory device 100. The controller 200 may in certain embodiments of the inventive concept include an error correction code (ECC) block of conventional design and operation. The ECC block essentially detects and/or corrects one or more data errors in read data retrieved from the semiconductor memory device 200.

As is conventionally understood, the semiconductor memory device 100 may include a memory cell array, a read/write circuit for writing and reading data into/from the memory cell array, an address decoder for decoding an externally transmitted address before transmitting the decoded address to the read/write circuit, and a control logic for controlling all operations of the semiconductor memory device 200. The semiconductor memory device 100 will be described below in some additional detail with reference to FIGS. 2 through 7.

The controller 200 and the semiconductor memory device 100 may be commonly integrated within a single integrated circuit device. In one embodiment, the controller 200 and the semiconductor memory device 100 are integrated within a memory card. For instance, the controller 200 and the semiconductor memory device 100 may be integrated into a PC card (PCMCIA), a compact flash card (CF), a smart media card (SM/SMC), a memory stick, a multimedia card (MMC, RS-MMC, MMCmicro), an SD card (SD, miniSD, microSD), and a universal flash memory device (UFS).

In another embodiment, the controller 200 and the semiconductor memory device 100 may be integrated to form a solid-state disk/drive (SSD). When the memory system 10 is a SSD, the operating speed of a host connected to the memory system 10 may be dramatically improved.

In still another embodiment, the memory system 10 may be applied to one of a computer, a portable computer, a UMPC, a workstation, a net-book, a PDA, a wet tablet, a wireless phone, a mobile phone, a smart phone, a digital camera, a digital audio recorder/player, a digital picture/video recorder/player, an apparatus for transmitting and receiving information under the wireless environment, one of various electronic devices constituting a home network, one of various electronic devices constituting a computer network, one of various electronic devices constituting a telematics network or one of various electronic devices, such as a solid-state disk/drive (SSD) or a memory card, constituting a computing system.

In some embodiments, the semiconductor memory device 100 or the memory system 10 may be mounted using various forms of packages. The semiconductor memory device 100 or the memory system 10 may be mounted using packages, for example, PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

The semiconductor memory device 100 may be a non-volatile memory device such as, for example, an SRAM, a DRAM or an SDRAM. Alternatively, the semiconductor memory device 100 may be a non-volatile memory device such as a ROM, a PROM, an EPROM, an EEPROM, a flash memory device, a PRAM, an MRAM, an RRAM or an FRAM. For brevity of explanation, an embodiment of the inventive concept will be described below under the assumption that the semiconductor memory device 100 is implemented as a flash memory device.

Figure 2:
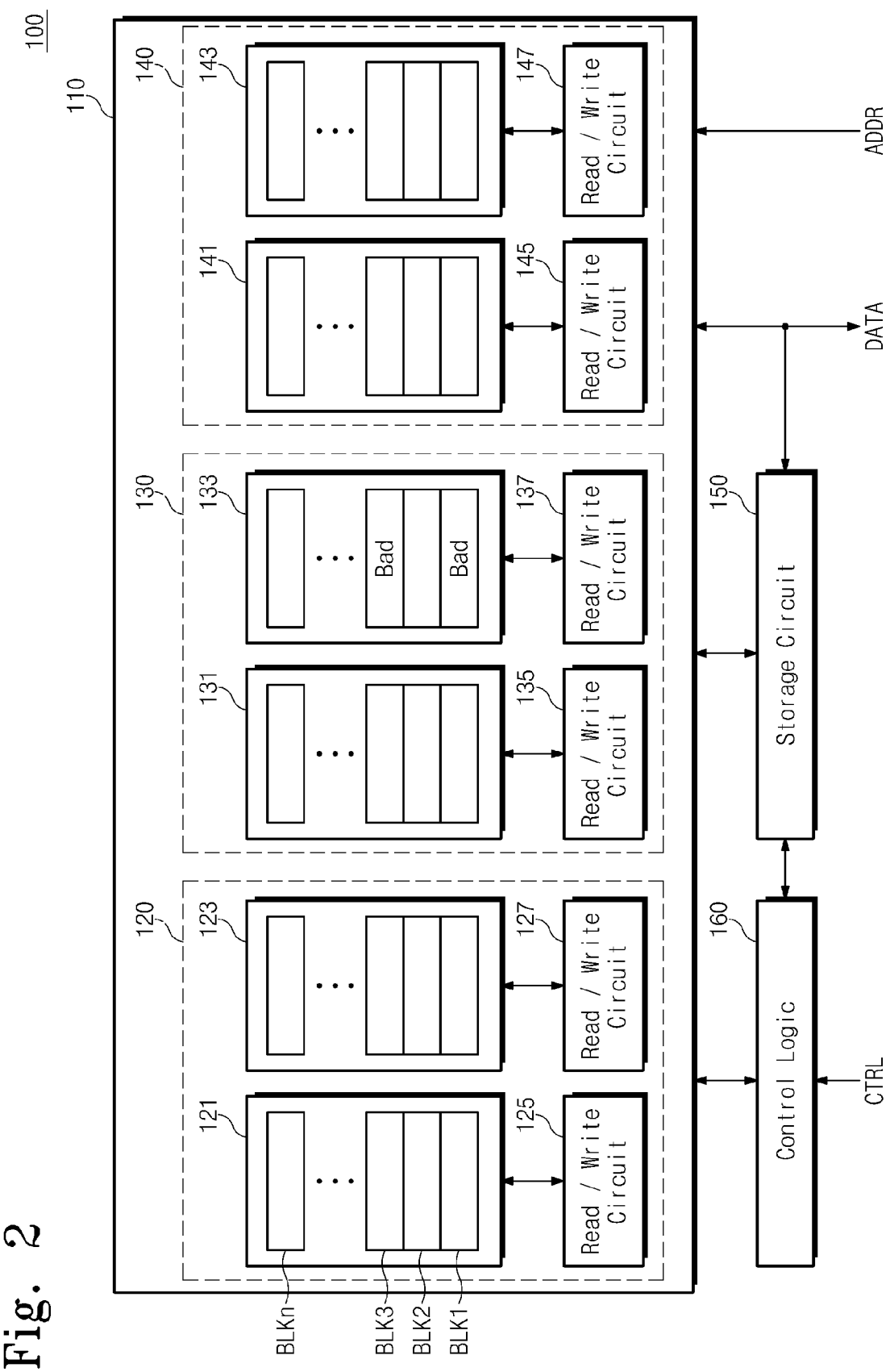
FIG. 2 is a block diagram further illustrating the flash memory device of FIG. 1.

FIG. 2 is a block diagram of a flash memory device 100, as an example of the flash memory device 100 of FIG. 1. The flash memory device 100 comprises a memory region 110, a storage circuit 150, and a control logic 160.

In the illustrated example, the memory region 110 is assumed to be implemented by a plurality of memory chips 120, 130, and 140 which operate under the control of the control logic 160. The memory region 110 is enabled to perform data communication with external data sources and destinations. The memory region 110 receives an externally supplied address (ADDR). The memory region 110 is configured to write externally provided write data (DATA) into a memory location specified by an address, and also provide read data (DATA) retrieved from a memory location specified by an address. In the working example, the memory region 110 is assumed to communicate data (i.e., DATA and related control signals, CTRL and ADDR) with the controller 200 of FIG. 1.

The first memory chip 120 includes at least two storage regions 121 and 123 and corresponding read/write circuits 125 and 127. In certain embodiments, the memory chip 120 may include at least two planes 121 and 123. In other embodiments, the memory chip 120 may include at least two banks 121 and 123.

The plane 121 of the memory chip 120 is connected to the read/write circuit 125. The read/write circuit 125 is configured to perform read/write operations for the plane 121. The plane 123 of the memory chip 120 is connected to the read/write circuit 127. The read/write circuit 127 is configured to perform read/write operations for the plane 123. Since the planes 121 and 123 are connected to the read/write circuits 125 and 127, respectively, a program operation or a read operation may be performed at the planes 121 and 123 at the same time.

Each of the planes 121 and 123 includes a plurality of memory blocks BLK1-BLKn each including a plurality of memory cells (not shown). In certain embodiments, each of the memory cells is a single level cell (SLC) used to store 1-bit data per memory cell. In other embodiments, each of the memory cells is a multi-level cell (MLC) used to store multi-bit data per memory cell.

Although not shown in FIG. 2, the memory chip 120 may include an address decoder that decodes an address ADDR to select a row and a column of the memory blocks BLK1-BLKn. In some exemplary embodiments, the address decoder may decode a row address to select a row of memory blocks BLK1-BLKn of a corresponding plane. The address decoder may decode a column address and transfer the decoded column address to read/write circuits 125 and 127 of the corresponding plane.

In certain embodiments, the read/write circuits 125 and 127 each include a sense amplifier, a write driver, a column select circuit selecting a column of memory blocks BLK1-BLKn in response to a column address from an address decoder, and a data input/output buffer. In other embodiments, a sense amplifier and a write driver of the respective read/writer circuits 125 and 127 may be embodied within the same circuit as a page buffer.

The second memory chip 130 may be organized with the same arrangement of circuits as the first memory chip 120. The second memory chip 130 includes at least two planes 131 and 133 and read/write circuits 135 and 137 respectively corresponding to the planes 131 and 133. Each of the planes 131 and 133 includes a plurality of memory blocks BLK1-BLKLn. Each of the memory blocks BLK1-BLKn includes a plurality of memory cells each being a single level cell (SLC) or a multi-level cell (MLC).

The storage circuit 150 is configured to store specific bad area write data from among the write data to be written into the plurality of memory chips 120, 130, and 140 within the memory region 110. The storage circuit 150 operates under the control of the control logic 160. In certain embodiments, the storage circuit 150 may be implemented as a register, a buffer or a latch. For example, the storage circuit 150 may be implemented as a first-in-first-out (FIFO) buffer or a data queue.

The control logic 160 is configured to control the memory region 110 and the storage circuit 150. The control logic 160 may control all operations of the flash memory device 100 and operate in response to externally provided control signal(s) CTRL. In the working example, the control signal CTRL is assumed to be provided from the controller 200 of FIG. 1.

In certain embodiments, the flash memory device 100 may be configured to execute a data access operation in relation to a plurality of planes. Thus, the flash memory device 100 may be configured to execute a 2-plane data access operation, for example.

That is, the flash memory device 100 receives write data to be written into memory blocks BLK1 of the planes 121 and 123 in the memory chip 120. The received write data to be written into the memory block BLK1 of the plane 121 in the memory chip 120 may be loaded to the read/write circuit 125 corresponding to the plane 121. The received write data to be written into the memory block BLK1 of the plane 123 in the memory chip 120 may be loaded to the read/write circuit 127 corresponding to the plane 123. The write data loaded to the read/write circuits 125 and 127 may be written into the memory blocks BLK1 of the corresponding planes 121 and 123. This operation may be equivalently performed in other memory chips 130 and 140 of the flash memory device 100.

In certain embodiments of the inventive concept, the flash memory device 100 executes an interleave program between the plurality of memory chips 120, 130, and 140. That is, the flash memory device 100 may receive write data to be written into one of the plurality of memory chips 120, 130, and 140. The received write data may then be loaded to a read/write circuit in one or more of the plurality of memory chips. Once the write data is loaded to the read/write circuit of a corresponding memory chip, the flash memory device 100 may start a program operation directed to the corresponding memory chip.

Until receiving the write data, loading the received write data to a read/write circuit, and starting the program operation in an address-indicted memory chip, the flash memory device 100 may be maintained at a busy state. When the program operation is started at the memory chip, the flash memory device 100 then enters a ready state. At this point, the flash memory device 100 may receive additional write data to be written into another memory chip (excepting only the memory chip currently performing the program operation) and load the additional write data to a corresponding read/write circuit of the other memory chip.

For example, after first write data to be written into the first memory chip 120 is loaded to the first read/write circuits 125 and 127, a first program operation may be performed in relation to the first memory chip 120. During execution of the first program operation, second write data to be written into the second memory chip 130 may be loaded to the second read/write circuits 135 and 137. When the second write data to be written into the second memory chip 130 is loaded to the second read/write circuits 135 and 137, the second program operation may be performed in relation to the second memory chip 130.

Thus, in certain embodiments of the inventive concept, the flash memory device 100 may execute a 2-plane program operation as an interleave program simultaneously directed (i.e., in some overlapping manner) to multiple memory devices.

In certain embodiments, the flash memory device 100 receive first write data to be written into first blocks BLK1 of both first and second planes 121 and 123 in the first memory chip 120. As shown in FIG. 2, the first memory blocks BLK1 of the first and second planes 121 and 123 in the first memory chip 120 are assumed to be normal blocks. Thus, the first write data transferred to the flash memory device 100 is loaded to the first read/write circuits 125 and 127 corresponding to the first memory blocks BLK1 of the first and second planes 121 and 123 in the first memory chip 120, respectively. Thereafter, a program operation may be performed in relation to the first memory blocks BLK1 of the first and second planes 121 and 123 of the first memory chip 120 via the first read/write circuits 125 and 127.

While this first program operation is being performed in the first memory chip 120, second write data to be written into the second memory chip 130 is transferred to the flash memory device 100. As shown in FIG. 2, a first memory block BLK1 of the second plane 133 in the second memory chip 130 is assumed to be a bad block. If a memory block indicated in one of two planes during a 2-plane program operation is a bad block, a conventional flash memory device must perform the entire program operation twice.

That is, the write data corresponding to the first memory block BLK1 of a first plane 131 in the second memory chip 130 is first loaded to the first read/write circuit 135 and a program operation is performed for the first memory block BLK1 of the second memory chip 130. Thereafter, the write data corresponding to the (bad) first memory block BLK1 of the second plane 133 in the second memory chip 130 must be written into a normal memory block (i.e., a substitute memory block) within the second memory chip 130. For example, it is assumed that the write data intended for the first memory block BLK1 of the second plane 133 is written instead to a third memory block BLK3 of the first plane 131 in the second memory chip 130.

Thus, following completion of a program operation directed to the first memory block BLK1 of the first plane 131 in the second memory chip 130, the write data intended for the first memory block BLK1 of the second plane 133 (i.e., a bad block) in the second memory chip 130 must be loaded (or re-loaded) to the read/write circuit 135. The write data intended for the first (bad) memory block BLK1 of the second plane 133 may then be programmed to the third memory block BLK3 of the first plane 131 in the second memory chip 130. Of note, the flash memory device 100 enters the ready state upon starting the second write operation programming the third memory block BLK3 of the first plane 131 in the second memory chip 130.

In a flash memory device executing a 2-plane program operation in an interleaved manner, if there is at least one bad memory block among the indicated memory blocks to which write data is to be written into, the program operation (a "reiterated program operation") will be performed for a corresponding memory chip at least twice. After starting the last iteration of the reiterated program operation, the flash memory device enters a ready state, i.e., an interleave program is executed.

Thus, in a flash memory device where a 2-plane program and an interleave program are executed at the same time, a bad memory block is a major source of extended operating time and reduced operating speed for the flash memory device. As the number of bad blocks increases, the resulting degradation in the performance of the flash memory device also increases.

In order to overcome the problem described above, a flash memory device 100 according to an embodiment of the inventive concept may be configured as follows. When first memory blocks BLK1 of the first planes 121 and 123 in the first memory chip 120 are normal memory blocks, the flash memory device may be configured to simultaneously execute program operations directed to these memory blocks. On the other hand, when one of the first memory blocks (e.g., first memory block BLK1 of the second plane 133 in the second memory chip 130) is a bad block, the flash memory device may be configured to store the write data intended for the bad memory block in the storage circuit 150.

Figure 3:
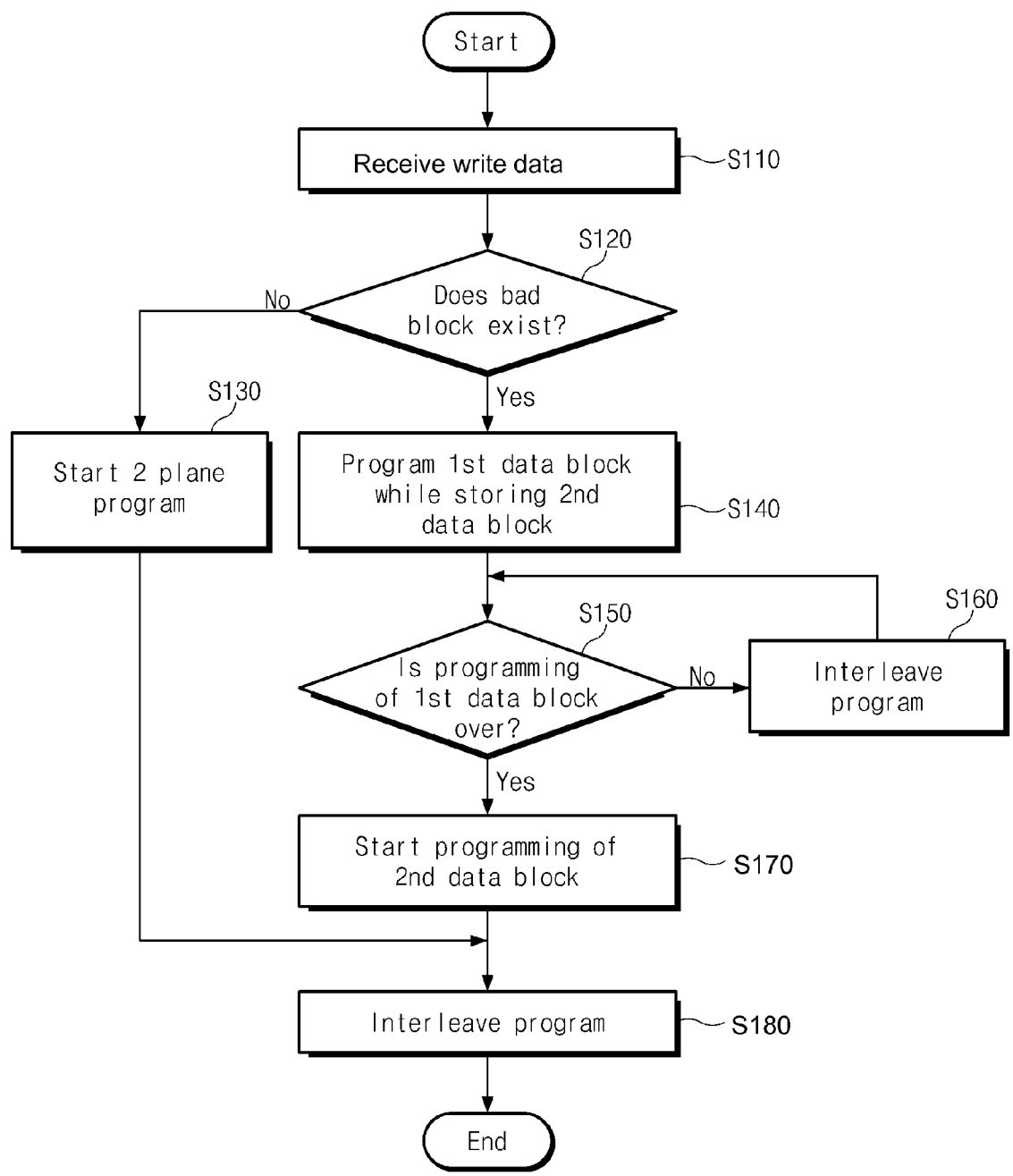
FIG. 3 is a flowchart summarizing a program operation executed in the flash memory device of FIG. 2.

FIG. 3 is a flowchart summarizing a write operation executed in a flash memory device 100 according to an embodiment of the inventive concept. FIGS. 4 to 7 are block diagrams further illustrating the write operation of FIG. 3. Referring to FIGS. 2 and 3, the flash memory device 100 receives write data (S110). Before or after receiving the write data, the flash memory device 100 may receive an address ADDR indicating a location in memory at which the write data is to be written.

The flash memory device 100 receives write data preparatory to executing a 2-plane program operation. In the illustrated embodiment, it is assumed that the flash memory device 100 receives two blocks of write data (DATA1 and DATA2) to be written respectively to first memory block BLK1 of the first plane 121 of the first memory chip 120, and a first memory block BLK1 of the second plane 123.

Upon receiving the write data, the control logic 160 determines whether one of the memory blocks to which the received write data is to be written is a bad block (S120). Consistent with the former description of FIG. 2, it is further assumed in this working example that both of the first memory blocks BLK 1 in the first and second planes 121 and 123 of the first memory chip 120 are not bad memory blocks (S120=NO). Accordingly, the 2-plane program operation is started as is conventional and the program operation proceeds as expected (S130).

That is, the 2-plane program is started (S130). The write data block (DATA1) to be written into the first memory block BLK1 of the first plane 121 in the first memory chip 120 is loaded to the read/write circuit 125, and the write data block (DATA2) to be written into the first memory block BLK1 of the second plane 123 in the first memory chip 120 is loaded to the read/write circuit 127. Thereafter, the program operation for the data blocks (DATA1 and DATA2) is executed under the control of the control logic 160.

Figure 4:
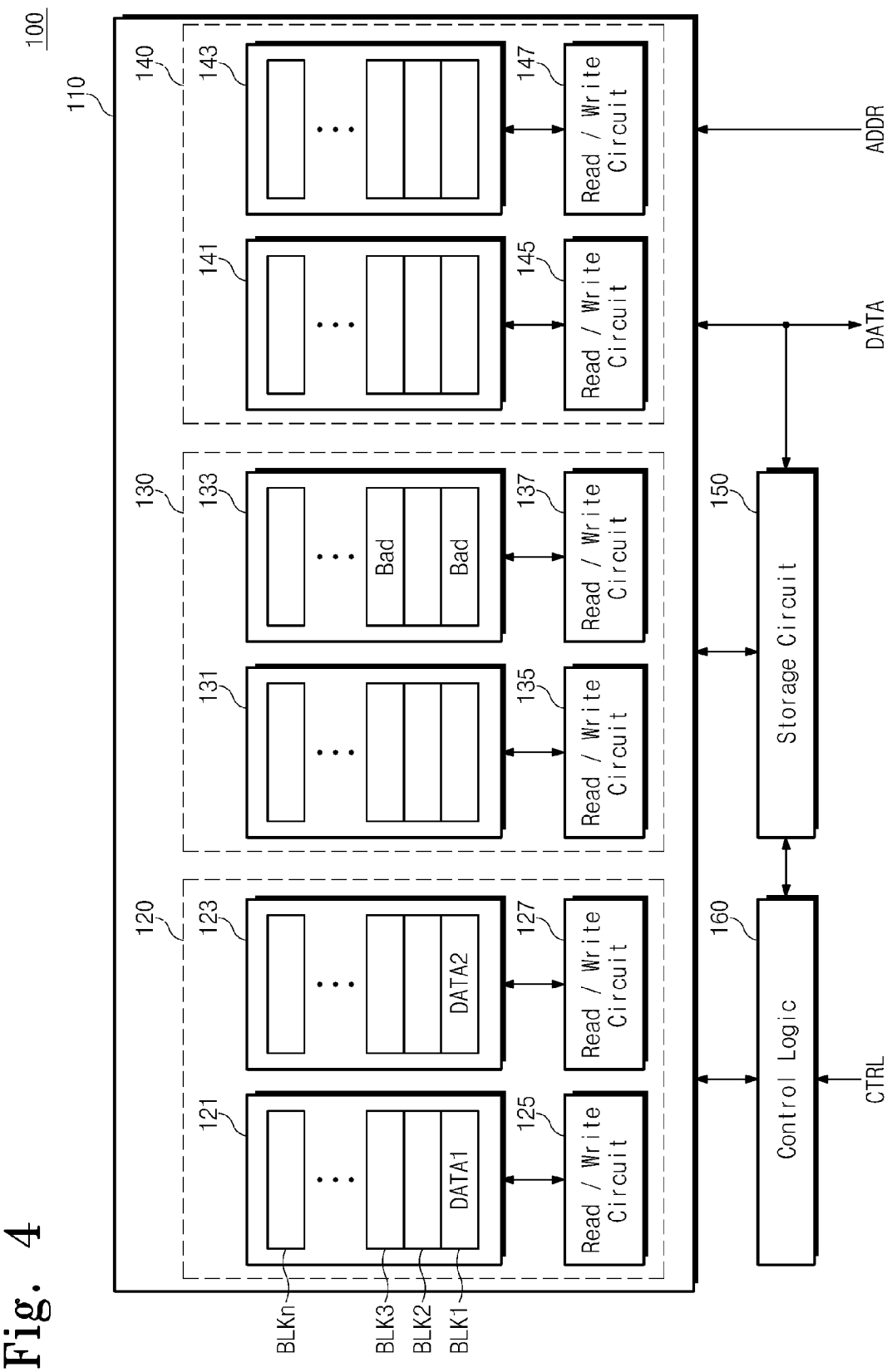
FIGS. 4 to 7 are related block diagrams further illustrating the program operation of FIG. 3.

The outcome of this normal 2-plane program operation is illustrated in FIG. 4. Referring to FIG. 4, the write data block (DATA1) is programmed to the first memory block BLK1 of the first plane 121, and the write data block (DATA2) is written to the first memory block BLK1 of the second plane 123 in the first memory chip 120. Following this outcome, an interleave program is executed (S170).

That is, in relation to certain embodiments of the inventive concept, it is further assumed that the flash memory device 100 receives write data directed to another memory chip (e.g., second or third memory chip 130 or 140) in the plurality of memory chips during execution of the "current program operation" directed to the first memory chip 120. Continuing with the working example, it is assumed that the flash memory device 100 receives additional (or "next") write data (DATA3 and DATA4) to be written into the first memory blocks BLK1 of the first and second planes 131 and 133 of the second memory chip 130.

The process of receiving next write data to be written into the second memory chip 130 may be simultaneous (i.e., at least partially overlapping) with execution of the current program operation in the first memory chip 120. That is, because programming write data to one memory chip and receiving write data for another memory chip are performed simultaneously, operating speed for the constituent memory device and memory system may be improved.

When the flash memory device 100 receives next write data DATA3 and DATA4 to be written into the second memory chip 130 (S110), the control logic 160 determines whether a bad block exists at the location in memory indicated for the next write data DATA3 and DATA4 (S120). As before, it is assumed that the next write data DATA3 and DATA4 are intended from first memory blocks BLK1 of the first and second planes 131 and 133 of the second memory chip 130, and that the first memory block BLK1 for the second memory chip 130 is a bad memory block. Accordingly, the method proceeds to S140.

Figure 5:
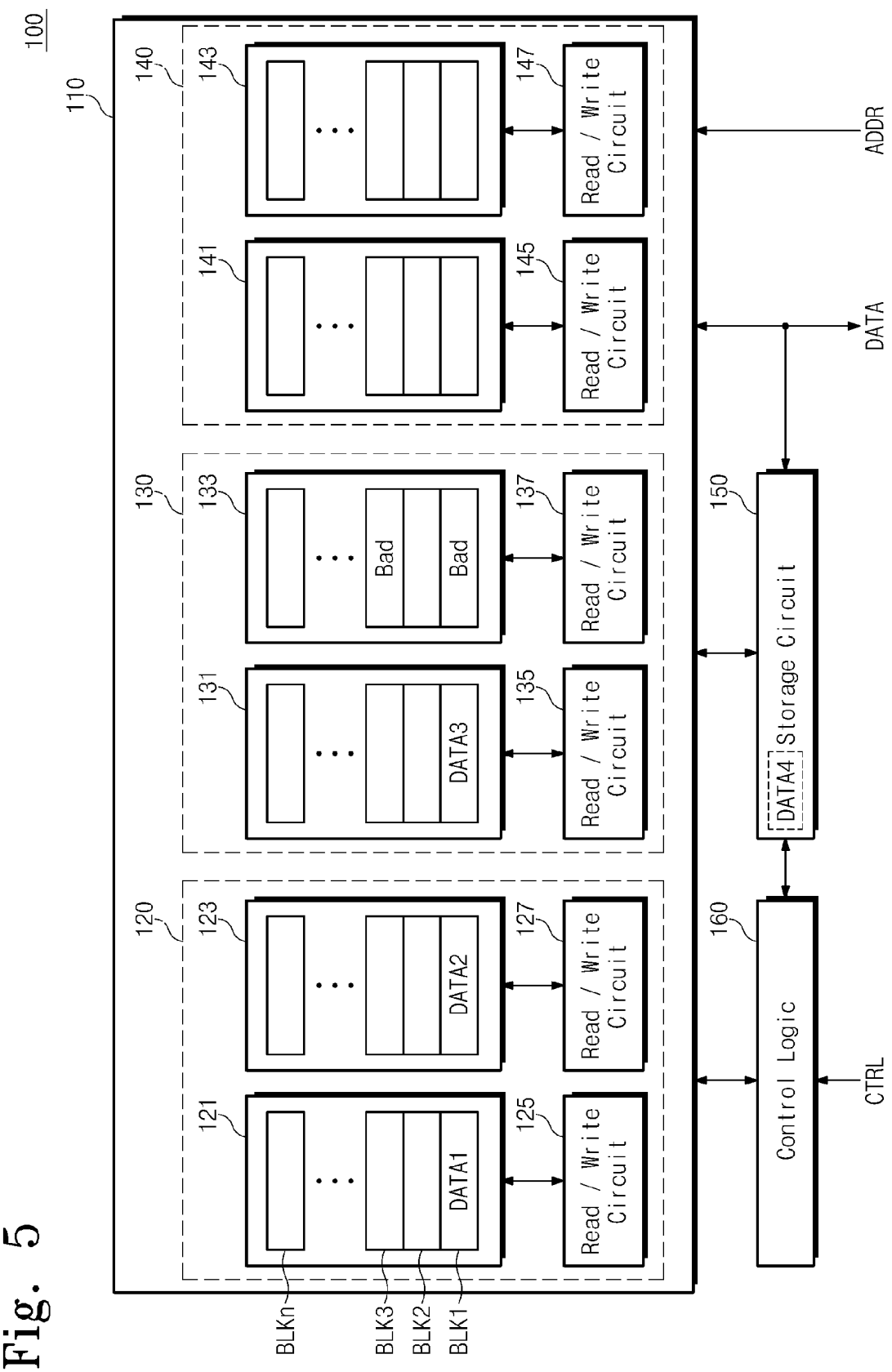

At S140, a program operation for the data block DATA3 is started and the data DATA4 is written into the storage circuit 150. In certain embodiments, the data block DATA3 may be loaded to a read/write circuit 135 corresponding to the first memory block BLK1 of the first plane 131 in the second memory chip 130 to which the data DATA3 is to be written. Thereafter, a program operation is performed in relation to the first memory block BLK1 of the first plane 131 in the second memory chip 130. The outcome of performing S140 is shown in FIG. 5. Referring to FIG. 5, the data block DATA3 is written into the first memory block BLK1 of the first plane 131 in the second memory chip 130, but the data block DATA4 is written into the storage circuit 150.

Returning to FIGS. 2 and 3, the control logic 160 determines whether the program operation related to the data block DATA3 is completed (S150). When the program operation of the data DATA3 is completed, the method proceeds to S170. When the program operation of the data DATA3 is not completed, the method proceeds to S160. At S150, because programming of the data block DATA3 is started for the first memory block BLK1 of the first plane 131 in the second memory chip 130, it is assumed that the program operation of the data DATA3 is not completed.

When it is determined that the program operation related to the data DATA3 is not completed, the method proceeds to S160 at which the flash memory device 100 executes the interleave program. That is, the flash memory device 100 may receive data to be written into one of the memory chips (e.g., memory chips 120 or 140) other than the (current) second memory chip 130 to which the data DATA3 is being programmed. In the illustrated embodiment, it is assumed that the flash memory device 100 receives next write data DATA5 and DATA6 to be written into the first memory blocks BLK1 of the first and second planes 141 and 143 in the third memory chip 140.

As shown in FIG. 2, the first memory blocks BLK1 of the first and second planes 141 and 143 in the third memory chip 140 are assumed to be normal memory blocks. Therefore, as set forth above at S110 and 130, the data DATA5 and DATA6 are programmed to the memory chip 140.

Figure 6:
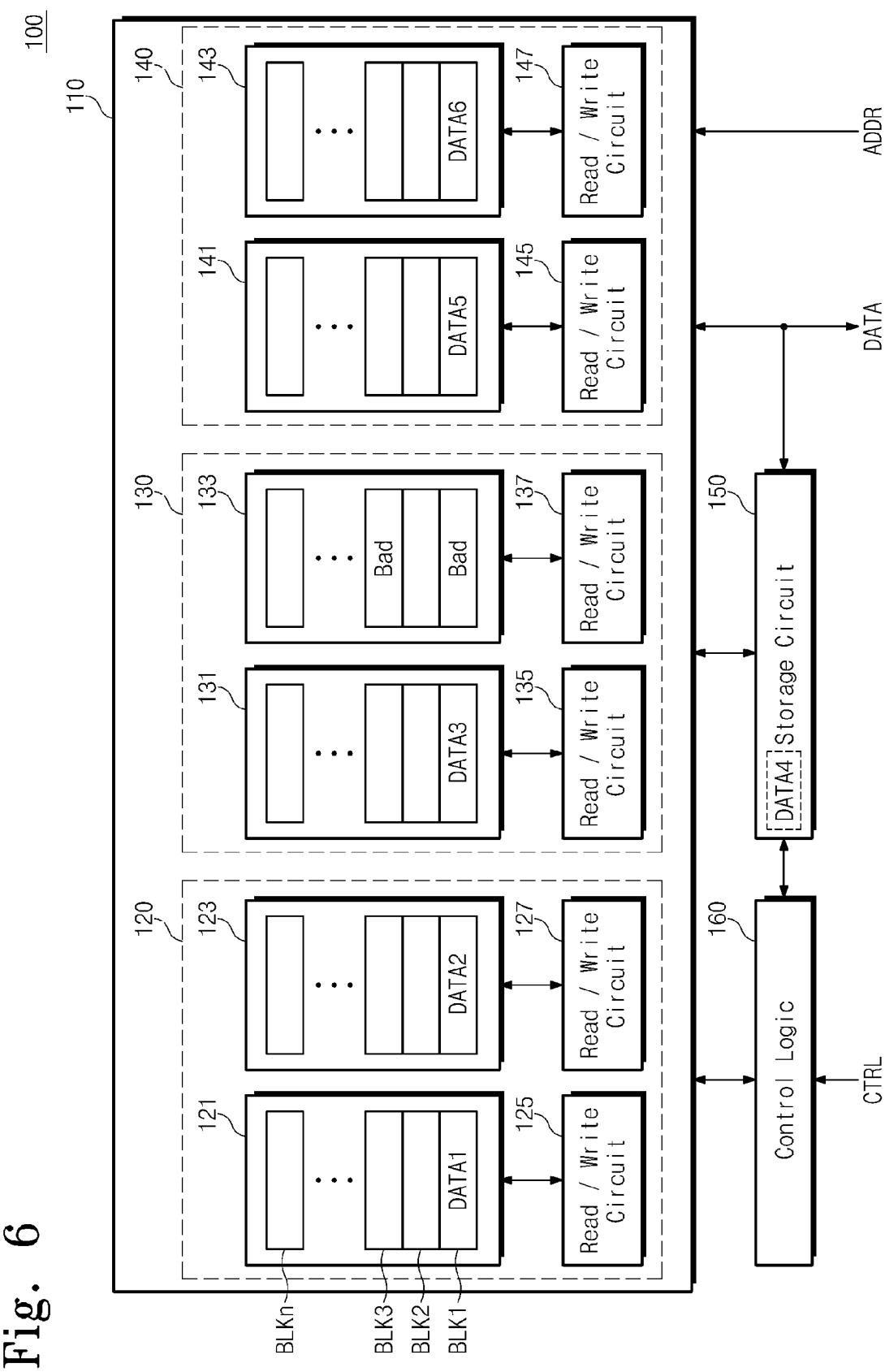

The next write data DATA5 may be loaded to a read/write circuit 145 corresponding to the first memory block BLK1 of the first plane 141 in the third memory chip 140 to which the data block DATA5 is to be written. The data DATA6 may be loaded to a read/write circuit 147 corresponding to the memory block BLK1 of the plane 143 in the memory chip 140 into which the data DATA6 is to be written. Thereafter, a program operation related to the data blocks DATA5 and DATA6 is started at the first memory blocks BLK1 of the first and second planes 141 and 143 in the third memory chip 140. The outcome of S160 is shown in FIG. 6. Referring to FIG. 6, the data block DATA5 is written into the first memory block BLK1 of the first plane 141 in the third memory chip 140, and the data block DATA6 is written into the first memory block BLK1 of the second plane 143 in the third memory chip 140.

Returning to FIGS. 2 and 3, when a program operation directed to the third memory chip 140 and related to the data blocks DATA5 and DATA6 is started, the control logic 160 determines whether programming of the data block DATA3 to the first memory block BLK1 of the first plane 131 in the second memory chip 130 is completed. If programming of the data DATA3 is not completed, an interleave program is executed for another one of the plurality of memory chips, excepting the second memory chip 130 to which the data block DATA3 is being programmed, and the third memory chip 140 to which the data blocks DATA5 and DATA6 are being programmed.

It will now be assumed that a program operation for the data DATA5 and DATA6 is started, and a program operation for the data DATA3 is completed. When it is determined that the program operation of the data DATA3 is completed, the control logic performs S170.

Figure 7:
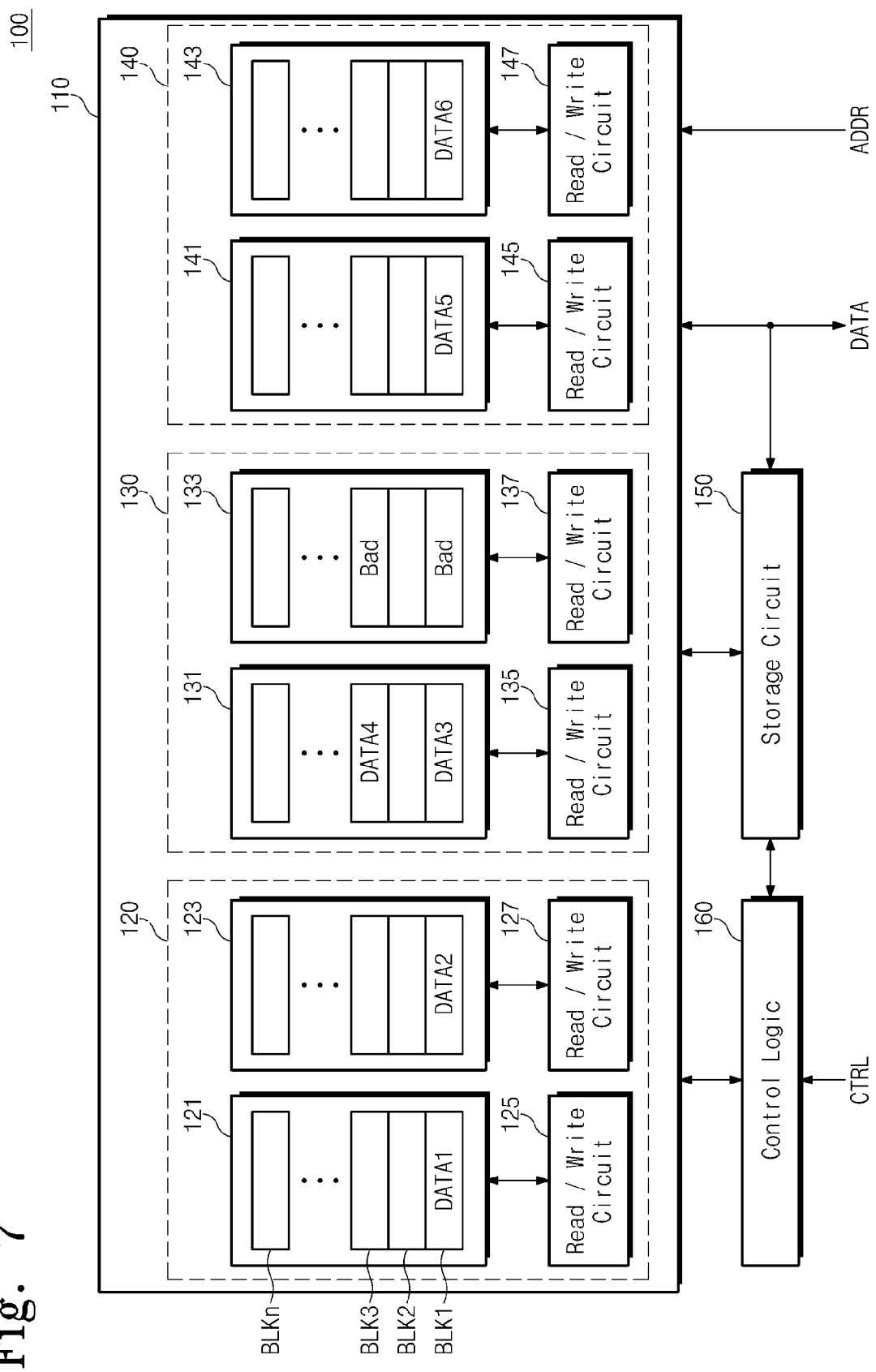

At S170, the control logic 160 controls the flash memory device to start programming the data DATA4 stored in the storage circuit 150. In certain embodiments of the inventive concept, the control logic 160 loads the data DATA4 stored in the storage circuit 150 to a read/write circuit 135 corresponding to a memory block BLK3 of the plane 131 in the memory chip 130 into which the data DATA4 is to be written. Thereafter, a program operation for the data block DATA4 is started at the third memory block BLK3 of the first plane 131 in second memory chip 130. The result of this outcome S170 is shown in FIG. 7. Referring to FIG. 7, the data DATA4 is written to the third memory block BLK3 of the first plane 131 in the third memory chip 130.

In an embodiment, an unpaired block of the memory blocks of the memory region 110 may be selected as a block which a temporarily buffered data (e.g. DATA4) is written. The unpaired block represents a free and normal memory block which is paired with a bad block in planes of a memory chip. For example, when a memory block (e.g. BLK3) of a first (or second) plane (e.g. 131 or 133) of a memory chip (e.g. 130) is a bad block, a memory block (e.g. BLK3) of a second (or first) plane (e.g. 133 or 131) of the memory chip (e.g. 130) corresponding to the bad block is the unpaired block. That is, the 2-plane program cannot be executed on the unpaired block. When the temporarily buffered data (e.g. DATA4) is written into the unpaired block, a number of unpaired blocks would decrease. Thus, a probability of selecting a pair of normal and bad blocks to execute 2-plane program as described referring to the step S120 to S160 may decrease. In an example, when any unpaired block exists, a normal block may be selected as a block which the temporarily buffered data.

As shown in FIG. 7, the third block BLK3 of the second plane 133 of the second memory chip 130 is assumed as a bad block. Thus, the temporarily buffered data DATA4 may be written into the third block BLK3 of the first plane 131 of the second memory chip 130.

Returning to FIGS. 2 and 4, if a program operation for the data DATA4 stored in the storage circuit 150 is started, the control logic 160 executes an interleave program (S180). That is, the flash memory device 100 may receive write data to be written into memory chips 120 or 140 except the memory chip 130 into which the data DATA4 is being written. When the flash memory device 100 receives the data to be written into memory chips 120 or 140 except the memory chip 130 into which the data DATA4 is being written, the control logic 160 writes the received data into the flash memory device 100 by means of the program operation set forth above at S110 to S180.

To sum up, the flash memory device according to the present inventive concept may execute an interleave program for a plurality of memory chips (e.g., 120-140) and a 2-plane program at the respective memory chips.

Among a storage region into which data is to be written (e.g., memory blocks BLK1 of planes 131 and 133 in a memory chip 130), if a part of the storage region (e.g., the memory block BLK1 of the plane 133 in the memory chip 130) is a bad region, the flash memory device 100 according to the present inventive concept writes data corresponding to a normal region (e.g., the memory block BLK1 of the plane 131 in the memory chip 130) into the normal region and writes data (e.g., DATA4) corresponding to the bad region (e.g., the memory block BLK1 of the plane 133 in the memory chip 130) into the storage circuit 150. Thereafter, the data DATA4 stored in the storage circuit 150 is written into a corresponding memory chip 130.

In some exemplary embodiments, the data DATA4 stored in the storage circuit 150 may be interleave-programmed into the memory chip 130. In some exemplary embodiments, the data DATA4 stored in the storage circuit 150 and externally received written data may be interleave-programmed into the memory chips 120-140.

For example, the data DATA4 stored in the storage circuit 150 may be loaded to the read/write circuit 135/137 of the memory chip 130 to which the data DATA4 is to be written, while a program operation is performed for memory chips 120 or 140 in the working example. Moreover, while the data DATA4 stored in the storage circuit 150 is written into the memory chip 130, the flash memory device 100 according to the present inventive concept may receive data to be written into another one of the plurality of memory chips (e.g., memory chips 120 or 140).

That is, the flash memory device 100 according to the inventive concept is configured to execute an interleave program for the first and second memory chips. In the second memory chip, if a portion of a storage region to which data is to be written is a bad region, the flash memory device 100 is configured to write, among data to be written, data corresponding to the bad region into a storage circuit and allow externally received data and the data stored in the storage circuit to be interleave-programmed into the first and second chips.

In the foregoing embodiments, embodiments of the inventive concept have been described with reference to a flash memory device. However, it will be understood that a semiconductor memory device according to the embodiments of the present inventive concept is not limited to a flash memory device. For example, it will be understood that the semiconductor memory device according to the embodiments of the present inventive concept may be a nonvolatile memory device such as an SRAM, a DRAM, and an SDRAM. Alternatively, it will be understood that the semiconductor memory device according to the embodiments of the present inventive concept may be a nonvolatile memory device such as a ROM, a PROM, an EPROM, an EEPROM, a flash memory device, a PRAM, an MRAM, an RRAM, and an FRAM.

In FIGS. 2 to 7, embodiments of the inventive concept have been described with reference to a semiconductor memory device. However, it will be understood that embodiments of the inventive concept are not limited to only semiconductor memory devices. For example, as described with reference to FIG. 1, embodiments of the inventive concept may be applied to a memory system 10 including a semiconductor memory device 100 and a controller 200 configured to control the semiconductor memory device 100.

In certain embodiments, it will be understood that the memory region 110 described with reference to FIGS. 2 to 7 corresponds to the semiconductor memory device 100 described with reference to FIG. 1. Further, it will be understood that the control logic 160 described with reference to FIGS. 2 to 7 corresponds to the controller 200 described with reference to FIG. 1. The controller 200 may include an interface for communication with an external host and an interface for communication with a semiconductor memory device 100.

If the semiconductor memory device 100 is a flash memory device, the controller 200 drives a flash translation layer (FTL) for controlling the semiconductor memory device 100. For example, a write operation according to embodiments described with reference to FIGS. 2 to 7 may be performed by an FTL. In some exemplary embodiments, an FTL may be converted to a physical address corresponding to a logical address transferred externally. In certain embodiments, an FTL may manage that memory blocks of the semiconductor memory device 100 are set to bad blocks.

In other embodiments, the storage circuit 150 may be provided as an element of the semiconductor memory device 100 or the controller 200. Alternatively, the storage circuit 150 may be provided as an element which is separated from the semiconductor memory device 100 and the controller 200. In yet other embodiments, the control logic 160 may be configured to control all operations of the semiconductor memory device 100 and the controller 200 may control the semiconductor memory device 100 to perform a write operation described with reference to FIGS. 2 to 7.

As previously described in the forgoing embodiments, a device including a memory region 110 (in FIG. 2), a storage circuit 150, and a control logic 160 is a semiconductor memory device 100 and a system including a semiconductor memory device 100 and a controller 200 is a memory system 10. However, the scope of the inventive concept is not limited to only the above-mentioned terms.

Figure 8:
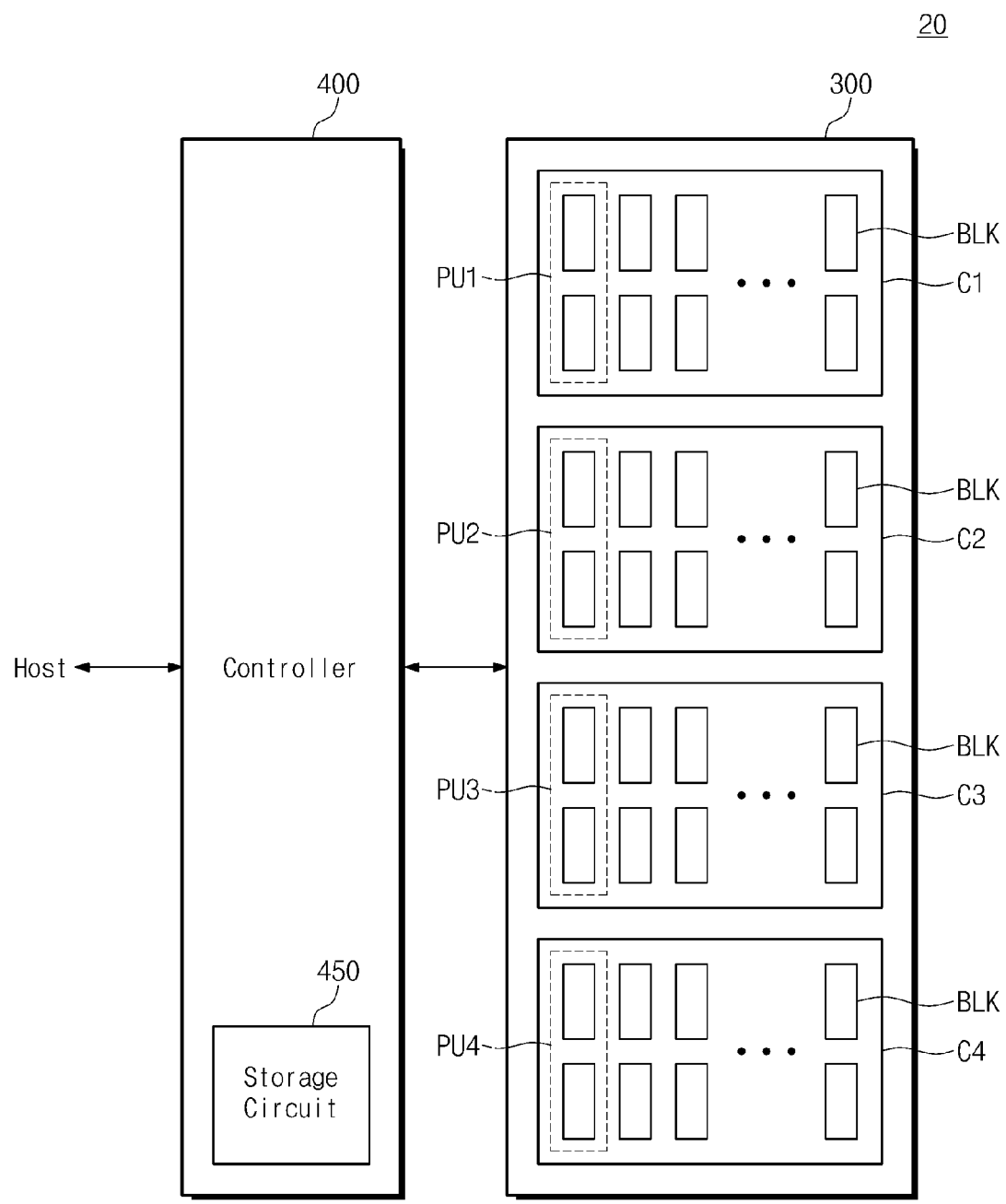
FIG. 8 is a block diagram a memory system according to another embodiment of the inventive concept.

FIG. 8 is a block diagram a memory system 20 according to another embodiment of the inventive concept. Referring to FIG. 8, the memory system 20 includes a semiconductor memory device 300 and a controller 400. The semiconductor memory device 300 includes a plurality of memory chips C1 to C4. As an example, four memory chips C1 to C4 are illustrated in FIG. 8. However, a number of the memory chips of the semiconductor memory device 300 are not limited.

Each memory chip comprises a plurality of memory blocks BLKs. For example, each row of memory blocks BLKs in each memory chip indicates a plane. In FIG. 8, it is illustrated that each memory chip includes two planes. However, a number of planes of each memory chip are not limited.

In a normal program mode, a program operation is performed in a unit of one memory block BLK in each memory chip. The program operation may be performed in a unit of one memory block of a plane of one of the memory chips C1 to C4. For example, the program operation is performed in a portion of a selected memory block (e.g. a page of a memory block BLK)

In a multi-plane program mode, the program operation is performed in a unit of a plurality of memory blocks BLKS in each memory chip. For example, the program operation may be performed in a unit of respective memory blocks BLKs of multi-planes of one of the memory chips C1 to C4. For example, the program operation is performed in a portion of selected respective memory blocks BLKs of multi-planes (e.g. respective pages of the plurality of memory blocks BLKS). In FIG. 8, each memory chip comprises two planes. Thus, two memory blocks of each memory chip composes a program unit PU1, PU2, PU3, or PU4. That is, the program operation is performed in a portion of the program unit PU1, PU2, PU3 or PU4 in each memory chip.

As described referring to FIG. 1 to FIG. 7, each memory chip may includes a read/write circuit (not shown). Thus, a program operation can be performed independently in the memory chips C1 to C4 respectively.

The controller 400 includes a storage circuit 450. The storage circuit 450 is configured to store write data corresponding to a bad block of the semiconductor memory device 300 as described referring to FIG. 1 to FIG. 7. For example, the storage circuit 450 is configured to temporarily buffer data corresponding to bad block of the semiconductor memory device 300.

The memory system 20 according to another embodiment of the inventive concept generally comprises a plurality of memory devices (e.g., first and second memory chips) and a controller configured to control a program operation directed to the plurality of memory devices. The controller is configured to receive write data intended for the plurality of memory chips. However, when a portion of memory in one of the plurality of memory chips to which the received write data is to be programmed is a bad area (hereafter "bad area write data"), the controller is configured to perform an interleave program operation in relation to the bad area write data which may be alternately written in a storage circuit.

As described above referring to FIG. 1 to FIG. 7, the memory system 20 is configured to perform a write operation including receiving write data, performing an interleave program, performing a multi-plane program, and writing the received write data corresponding to a bad block into the storage circuit 450. For example, the write operation is performed under a control of the controller 400. For example, control operations described referring to the control logic 160 in FIG. 1 to FIG. 7 may be performed by the controller 450.

In an embodiment each memory chip may includes at lease one of various nonvolatile memories such as a ROM, a PROM, an EPROM, an EEPROM, a flash memory device, a PRAM, an MRAM, an RRAM or an FRAM.

Figure 9:
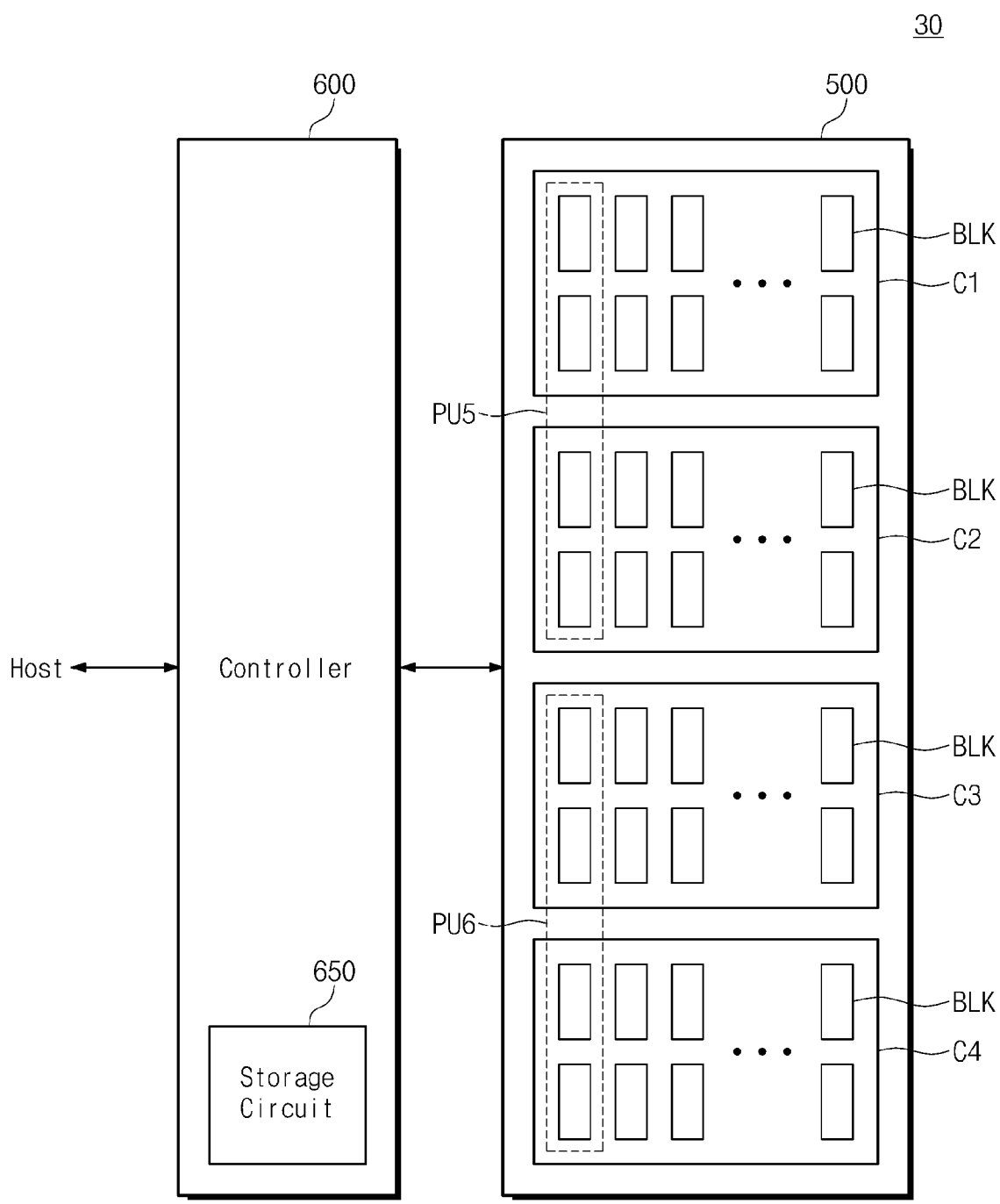
FIG. 9 is a block diagram a memory system according to another embodiment of the inventive concept.

FIG. 9 is a block diagram a memory system 30 according to another embodiment of the inventive concept. Referring to FIG. 9, the memory system 30 includes a semiconductor memory device 500 and a controller 600. The semiconductor memory device 500 includes a plurality of memory chips C1 to C4. As an example, four memory chips C1 to C4 are illustrated in FIG. 9. However, a number of the memory chips of the semiconductor memory device 500 are not limited.

When compared with the memory system 20 of FIG. 8, the memory system 30 provides a different size of a program unit. For example, respective memory blocks of multi-planes of a plurality of memory chips may compose a program unit. In FIG. 9, it is illustrated that respective four memory blocks BLKs of four planes of two memory chips C1 and C2 or C3 and C4 composes the program unit PU5 or PU6. Thus, in a multi-plane program mode, a program operation of four memory blocks of two memory chips C1 and C2 or C3 and C4 may be performed simultaneously. In FIG. 9, it is illustrated that respective four memory blocks of four planes of two memory chips compose one program unit. However, a number of memory chips, plane or memory blocks composing the program unit are not limited, As described above referring to FIG. 1 to FIG. 7, the memory system 30 is configured to perform a write operation including receiving write data, performing an interleave program, performing a multi-plane program, and writing the received write data corresponding to a bad block into the storage circuit 650. For example, the multi-plane program may be performed over a plurality of memory chips. For example, the write operation is performed under a control of the controller 600. For example, control operations described referring to the control logic 160 in FIG. 1 to FIG. 7 may be performed by the controller 650.

Figure 10:
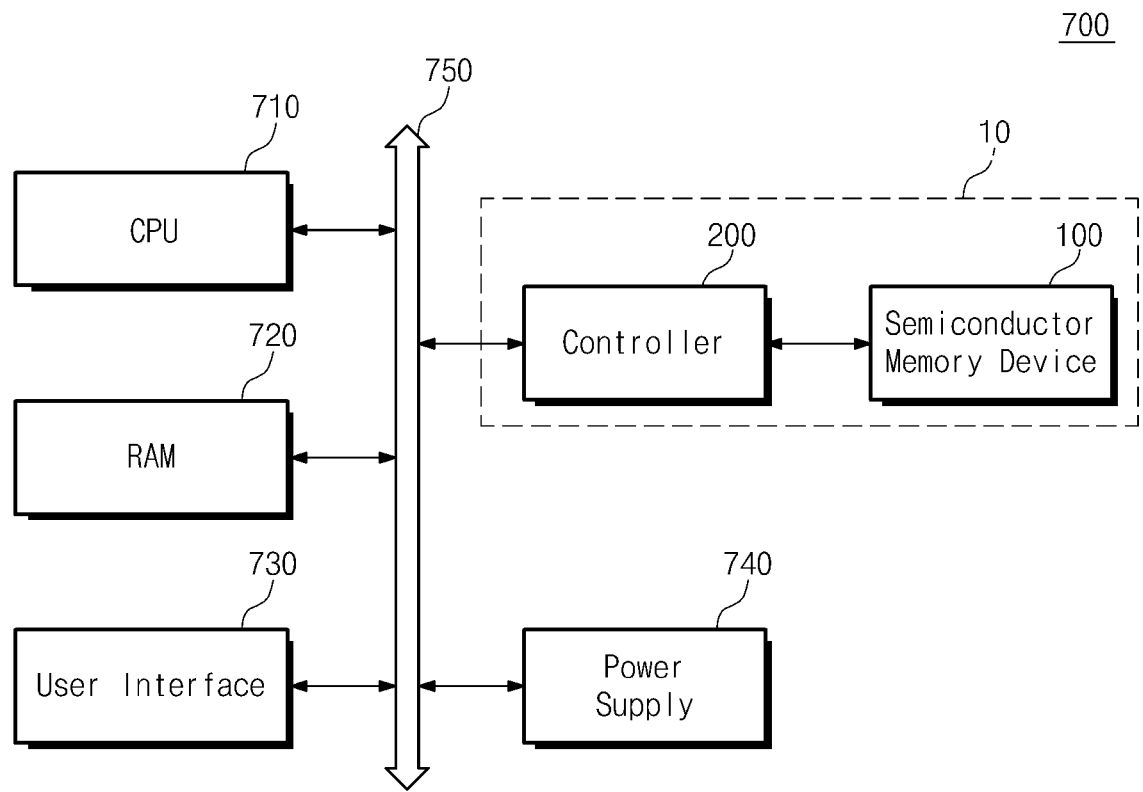
FIG. 10 is a block diagram illustrating a computational system including the memory system of FIG. 1.

FIG. 10 is a block diagram illustrating an embodiment of a computational system 700 including the memory system 10 shown in FIG. 1. The computational system 700 comprises a central processing unit (CPU) 710, a random access memory (RAM) 720, a user interface 730, a power supply 740, and the memory system 10.

The memory system 10 is electrically connected to the CPU 710, the RAM 720, the user interface 730, and the power supply 740 through a system bus 750. Data provided through the user interface 730 or processed by the CPU 710 is stored in the memory system 10. The memory system 10 includes a semiconductor memory device 100 and a controller 200.

In some embodiments, the semiconductor memory device 100 may be configured to perform a write operation according to embodiments of the present inventive concept described with reference to FIGS. 2 to 7. In other embodiments, the memory system 10 may be configured to perform a write operation according to embodiments of the inventive concept described with reference to FIGS. 2 to 7.

In an embodiment, the memory system 20 of FIG. 8 or the memory system 30 of FIG. 9 can be provided as an element of the computational system 700 instead of the memory system 10 of FIG. 1. In an embodiment, at least two of the memory systems 10, 20 and 30 can be provided as an element of the computational system 700.

In the case where the memory system 10 includes a solid-state disk (SSD), boosting speed of the computational system 300 may be improved dramatically. Although not shown in the figure, it will be understood by those skilled in the art that a system according to the inventive concept may further include an application chipset, a camera image processor and so forth.

According to embodiments of the inventive concept, if one of two memory blocks is a bad block, a semiconductor memory device stores data corresponding to the bad block in a storage circuit. When a program operation for a normal one of the blocks is completed, the semiconductor memory device writes the data stored in the storage circuit into a memory block. Thus, write speed of the semiconductor memory device is improved.

Although the inventive concept has been described in connection with certain embodiments illustrated in the accompanying drawings, it is not limited thereto. It will be apparent to those skilled in the art that various substitutions, modifications and changes may be made without departing from the scope of the inventive concept.

What is claimed is:

1. A semiconductor memory device comprising:
   first and second memory chips; and
   a control logic configured to execute an interleave program between the first and second memory chips, receive write data to be written into first and second memory blocks of the first memory chip, and simultaneously perform a program operation for the first and second memory blocks, if the first and second memory blocks are normal blocks, but write the received write data corresponding to one memory block of the first and second memory blocks into a storage circuit if the one memory block is a bad block.

2. The semiconductor memory device of claim 1, wherein if the first and second memory blocks are normal blocks, the control circuit loads data to be written into the first and second memory blocks to a write circuit of the first memory chip, and loads data to be written into the second memory chip to a write circuit of the second memory chip during execution of the program operation directed to the first memory chip.

3. The semiconductor memory device of claim 1, wherein:
   if the one memory block is a bad block, the control logic loads data to be written into the other one of the first and second memory blocks to a write circuit of the first memory chip, but writes data corresponding to the one memory block into the storage circuit, and loads data to be written into the second memory chip to a write circuit of the second memory chip during a program operation directed to the other one of the first and second memory blocks.

4. The semiconductor memory device of claim 3, wherein:
   when the program operation directed to the first memory block is completed, the control logic loads the data stored in the storage circuit to a third memory block of the first memory chip.

5. The semiconductor memory device of claim 4, wherein:
   when a free memory block which is paired with a bad block exists, the control logic selects the free memory block as the third memory block.

6. The semiconductor memory device of claim 5, wherein:
when no free memory block paired with a bad block exists, the control logic selects any one of free memory block of the first memory chip as the third memory block.

7. The semiconductor memory device of claim 4, wherein:
while a program operation directed to the third memory block is being performed, the control logic loads data to be written into the second memory chip to the write circuit of the second memory chip.

8. The semiconductor memory device of claim 1, further comprising a plurality of memory chips,
wherein the control logic is further configured to control the interleave program for the first, second and the plurality of memory chips with a unit of at least two memory chips.

9. A memory system comprising:
a semiconductor memory device including a first memory chip; and
a controller configured to control execution of operations in the semiconductor memory device,
wherein the controller is configured to control a receipt of write data to be written into first and second memory blocks of the first memory chip, and simultaneously perform a program operation for the first and second memory blocks if the first and second memory blocks are normal blocks, but write data corresponding to one memory block of the first and second memory blocks into a storage circuit if the one memory block is a bad block.

10. The memory system of claim 9, wherein the semiconductor memory device further comprises a second memory chip,
wherein the controller further configured to control execution of an interleave program between the first and second memory chips.

11. The memory system of claim 10, wherein
if the first and second memory blocks are normal blocks, the controller is further configured to load data to be written into the first and second memory blocks to a write circuit of the first memory chip, and load data to be written into the second memory chip to a write circuit of the second memory chip during execution of the program operation directed to the first memory chip.

12. The memory system of claim 10, wherein
if the one memory block is a bad block, the controller is further configured to load data to be written into the other one of the first and second memory blocks to a write circuit of the first memory chip, but write data corresponding to the one memory block into the storage circuit, and load data to be written into the second memory chip to a write circuit of the second memory chip during a program operation directed to the other one memory block.

13. The memory system of claim 12, wherein:
when the program operation directed to the first memory block is completed, the controller loads the data stored in the storage circuit to a third memory block of the first memory chip.

14. The memory system of claim 13, wherein:
when a free memory block which is paired with a bad block exists, the controller selects the free memory block as the third memory block.

15. The memory system of claim 14, wherein:
when no free memory block paired with a bad block exists, the controller selects any one of free memory block of the first memory chip as the third memory block.

16. The memory system of claim 9, wherein the semiconductor memory device further comprises a plurality of memory chips,
wherein the controller further configured to control execution of an interleave program for the first and the plurality of memory chips with a unit of at least two memory chips.

17. A memory system comprising:
a semiconductor memory device; and
a controller configured to control the semiconductor memory device,
wherein the semiconductor memory device comprises:
first and second memory chips; and
a control logic configured to execute an interleave program between the first and second memory chips, and
wherein the control logic receives write data to be written into first and second memory blocks of the first memory chip, and performs a program operation for the first and second memory blocks simultaneously if the first and second memory blocks are normal blocks and writes data corresponding to the second memory block in a storage circuit if the second memory block is a bad block.

18. The memory system of claim 17, wherein the semiconductor memory device and the controller are integrated into one semiconductor device.

19. The memory system of claim 17, wherein the semiconductor memory device and the controller constitute a solid-state drive (SSD).

20. The memory system of claim 17, wherein the semiconductor memory device and the controller constitute a memory card.

* * * * *